United States Patent
Teng et al.

(10) Patent No.: US 7,383,477 B2
(45) Date of Patent: Jun. 3, 2008

(54) INTERFACE CIRCUIT FOR USING A LOW VOLTAGE LOGIC TESTER TO TEST A HIGH VOLTAGE IC

(75) Inventors: Cheng Yung Teng, Hsin Tien (TW); Yi Chang Hsu, BanChiao (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 254 days.

(21) Appl. No.: 11/194,663

(22) Filed: Aug. 2, 2005

(65) Prior Publication Data

US 2007/0168787 A1    Jul. 19, 2007

(51) Int. Cl.
*G01R 31/28* (2006.01)

(52) U.S. Cl. .................. 714/724; 714/25; 714/742; 714/745

(58) Field of Classification Search ............... None
See application file for complete search history.

(56) References Cited

U.S. PATENT DOCUMENTS

| | | | |
|---|---|---|---|
| 6,538,420 B2 * | 3/2003 | Chen et al. | 324/114 |
| 6,647,526 B1 * | 11/2003 | Holder et al. | 714/743 |
| 7,138,792 B2 * | 11/2006 | Fu et al. | 324/158.1 |
| 7,162,672 B2 * | 1/2007 | Werner et al. | 714/724 |

OTHER PUBLICATIONS

Product Data Sheet "KH205", published at www.fairchild.com in Feb. 2001, p. 4.*

* cited by examiner

*Primary Examiner*—John P Trimmings
(74) *Attorney, Agent, or Firm*—Muncy, Geissler, Olds & Lowe, PLLC

(57) ABSTRACT

The present invention provides an interface circuit for using a low voltage logic tester to test a high voltage IC. The interface circuit is between the high voltage IC and the low voltage logic tester, and is used for converting each output of the high voltage IC to a voltage level that the low voltage logic tester can accept, so as to reduce the cost of the testing.

7 Claims, 2 Drawing Sheets

INTERFACE CIRCUIT FOR USING A LOW VOLTAGE LOGIC TESTER TO TEST A HIGH VOLTAGE IC

FIELD OF THE INVENTION

The present invention relates to an interface circuit for using a low voltage logic tester to test a high voltage IC. The high voltage output of the high voltage IC will be converted by the interface circuit to a voltage level that the low voltage logic tester can accept.

BACKGROUND OF THE INVENTION

In accordance with the trend of thin monitor and TV, the demand for high voltage IC of plasma/LCD panel is increasing rapidly. In order to maintain the quality and yield of the high voltage IC, testing the high voltage IC after mass production is necessary. However, the high voltage IC has outputs up to 80V~100V and even higher, but a conventional low voltage logic tester is equipped with a power supply below 40V, and provides an output comparator level lower than 12V. If a special designed high voltage logic tester is employed to test the high voltage IC, it is apparent that the testing cost will increase dramatically.

SUMMARY OF THE INVENTION

The present invention is to provide an interface circuit for using a low voltage logic tester to test a high voltage IC. The interface circuit comprises:

an inrush current eliminating circuit for connecting with a high voltage power supply to eliminate an inrush current generated by the high voltage power supply, and provide the high voltage of the high voltage power supply to a high voltage power pin of the high voltage IC;

a first controller for connecting with each output pin of the high voltage IC, and a plurality of control switches in the first controller are used for conducting an open/short test, a function pattern test, or a standby current test;

a second controller between the first controller and the low voltage logic tester, and a plurality of control switches in the second controller are used for cooperating with the first controller to control each output pin of the high voltage IC to be connected with an attenuator stated below;

an attenuator between the first controller and the low voltage logic tester for attenuating each output of the high voltage IC to a voltage level that the low voltage logic tester can accept.

The present invention will become more obvious from the following description when taken in connection with the accompanying drawings, which show, for purpose of illustrations only, the preferred embodiment in accordance with the present invention.

DETAILED DESCRIPTION OF THE PREFERRED EMBODIMENT

Figure 1:
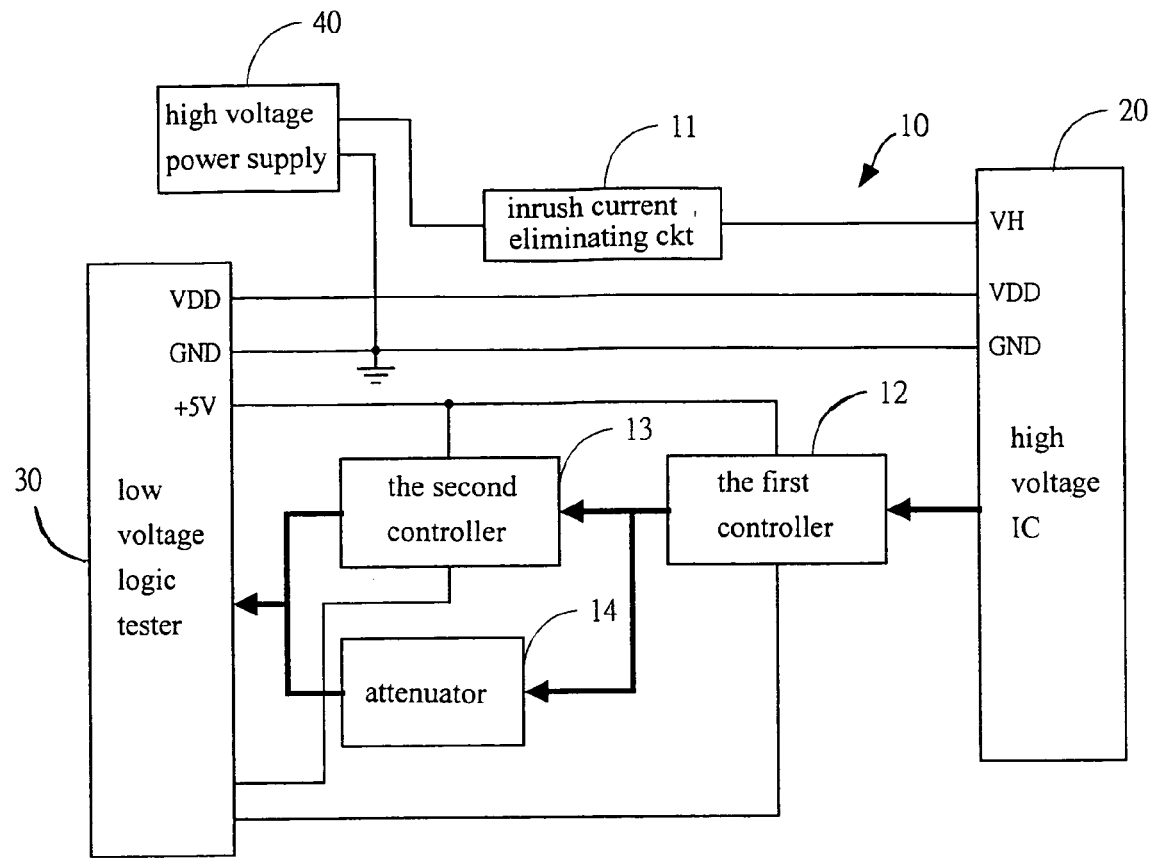
FIG. 1 shows a block diagram of the interface circuit according to the present invention.

Referring to FIG. 1, which shows the system block of the present invention, in which an interface circuit 10, a high voltage IC 20, a low voltage logic tester 30 and a high voltage power supply 40 is included.

The interface circuit 10 between the high voltage IC 20 and the low voltage logic tester 30 is used for converting each output of the high voltage IC 20 to a voltage level that the low voltage logic tester 30 can accept.

The interface circuit 10 comprises an inrush current eliminating circuit 11, a first controller 12, a second controller 13 and an attenuator 14.

Figure 2:
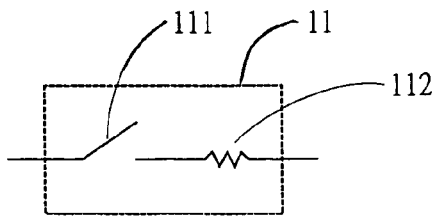
FIG. 2 shows an inrush current eliminating circuit according to the present invention.

Referring to FIG. 2, the inrush current eliminating circuit 11 comprises a switch device 111 and a resistor 112 series-connected each other. The high voltage power supply 40 provides voltage power to the high voltage IC 20. But the high voltage of the high voltage power supply 40 will induce inrush current, the present invention uses the inrush current eliminating circuit 11 to eliminate the inrush current generated by the high voltage power supply 40, and provides the high voltage to a high voltage power pin VH of the high voltage IC 20.

Figure 3:
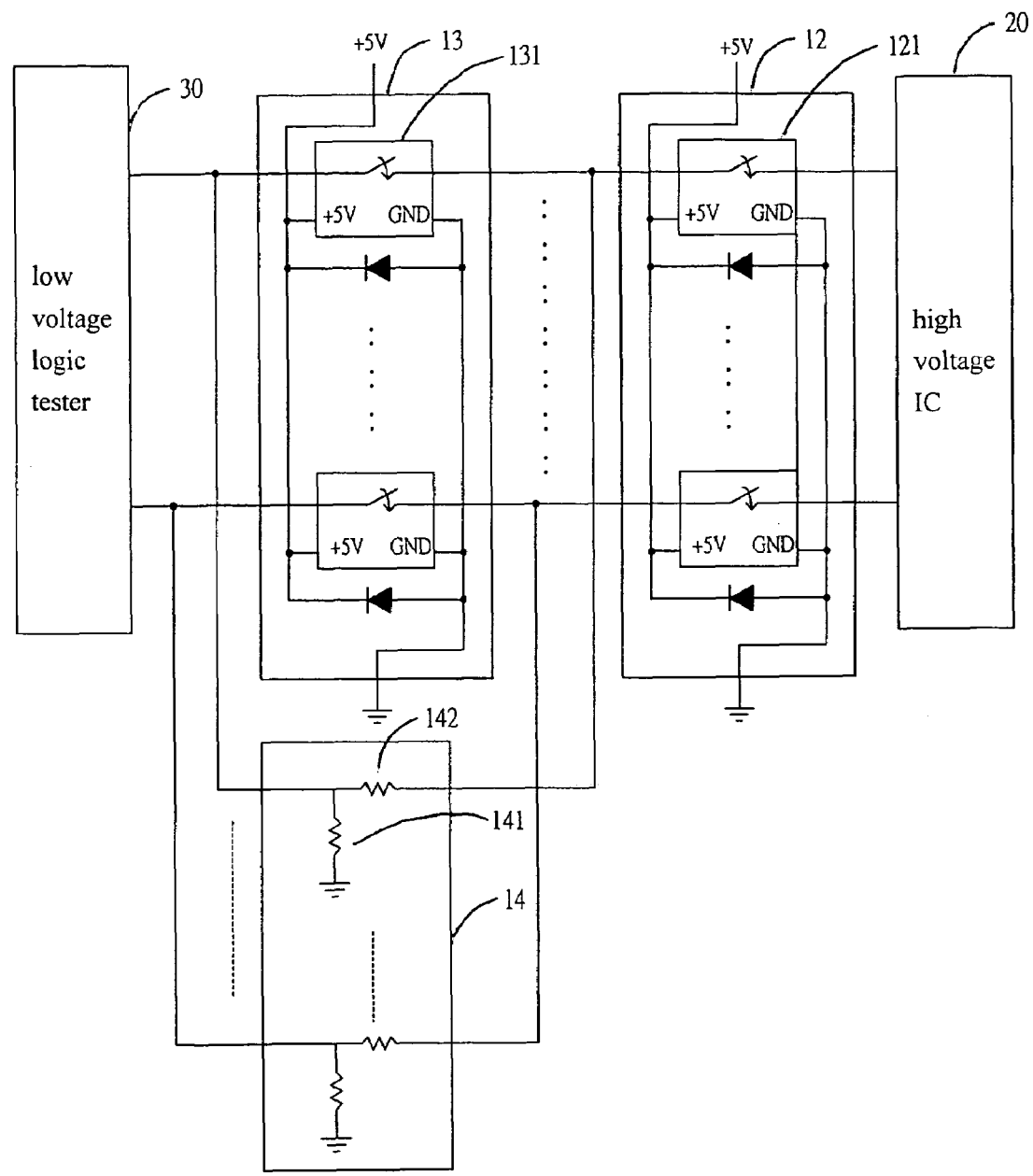
FIG. 3 shows the detailed circuit diagram of the block diagram in FIG. 1.

Referring to FIG. 3, the first controller 12 is connected with each output pin of the high voltage IC 20, the first controller 12 has a plurality of control switches 121, the number of the plurality of control switches 121 corresponds to the number of the output pins of the high voltage IC 20, the low voltage logic tester 30 will control the plurality of control switches 121 conducting or open, for conducting an open/short test, a function pattern test, or a standby current test.

The second controller 13 is between the first controller 12 and the low voltage logic tester 30. The second controller 13 has a plurality of control switches 131, the number of the plurality of control switches 131 corresponds to the number of the output pins of the high voltage IC 20, the low voltage logic tester 30 will control the plurality of control switches 131 and cooperate with the first controller 12 for passing all the outputs of the high voltage IC 20 through an attenuator 14 or not.

The attenuator 14 is connected with the first controller 12 for attenuating the outputs of the high voltage IC 20 to a voltage level that the low voltage logic tester 30 can accept. The attenuator 14 comprises a plurality of resistor pairs 141, 142 connected serially. The number of the plurality of resistor pairs 141, 142 corresponds to the number of the output pins of the high voltage IC 20. In this embodiment, the resistance ratio of the resistor pair 141, 142 is 1:9, therefore the voltage on the resistor 141 will be 1/10 of the output voltage of the high voltage IC 20, so as to fall in the voltage range that the low voltage logic tester 30 can accept.

The testing method of using the interface circuit 10 of the present invention is stated as below:

1. Open & short test

Testing purpose: for testing the open/short status between each output pin of the high voltage IC 20 and the low voltage logic tester 30.

Testing steps:

a. The low voltage logic tester 30 sets the first controller 12 and the second controller 13 to be conducting, i.e. let the control switch 121, 131 to be connected to the ground.

b. Since the second controller 13 is conducting, the attenuator 14 is bypassed, and each output pin of the high voltage IC 20 is directly connected with the low voltage logic tester 30 for testing.

2. Function Pattern Test

Testing purpose: for checking the function and output voltage of the high voltage IC 20.

Testing steps:
a. The low voltage logic tester 30 sets the first controller 12 to be conducting, and sets the second controller 13 to be open, i.e. let the control switch 121 of the first controller 12 to be connected to ground to make each of the control switch 121 conducting; and let the control switch 131 of the second controller 13 to be connected to +5V to make each of the control switch 131 open.
b. Set the switch device 111 in the inrush current eliminating circuit 11 to be conducting, so as to let the high voltage outputted from the high voltage power supply 40 to be provided to the high voltage power pin (VH) of the high voltage IC 20 through the inrush current eliminating circuit 11.
c. Since the first controller 12 is conducting and the second controller 13 is open, the output of the first controller 12 will pass through the attenuator 14 for voltage attenuation, and then send to the low voltage logic tester 30 for function pattern test and output compare level test (<12V).

3. Standby Current Test

Testing purpose: for checking the high voltage static standby current of the high voltage IC 20.

Testing steps:
a. The low voltage logic tester 30 sets the first controller 12 to be open, i.e. let the control switch 121 of the first controller 12 to be connected to +5V so as to make each of the control switch 121 to be open, therefore each output pin of the high voltage IC 20 will be in no loading/floating status, and will not be influenced by the attenuator 14.
b. Set the switch device 111 in the inrush current eliminating circuit 11 to be conducting, so as to let the high voltage outputted from the high voltage power supply 40 to be provided to the high voltage power pin (VH) of the high voltage IC 20 through the inrush current eliminating circuit 11.
c. Use the high voltage power supply 40 to conduct high voltage current test.
d. Read the measurement to the low voltage logic tester 30 through a GPIB interface for conducting the standby current test. (The standby current is generally lower than 1 µA.)

The spirit and scope of the present invention depend only upon the following Claims, and are not limited by the above embodiments.

What is claimed is:

1. An interface circuit for using a low voltage logic tester to test a high voltage IC, the interface circuit is between the high voltage IC and the low voltage logic tester, a high voltage power supply is used to provide high voltage power to the high voltage IC, the interface circuit comprises:

a first controller for connecting with the output pins of the high voltage IC to conduct an open and short test, a function pattern test, or a standby current test of the high voltage IC by internal control switches thereof;

an attenuator between the first controller and the low voltage logic tester for attenuating each output of the high voltage IC to a voltage level that the low voltage logic tester can accept, and a second controller between the first controller and the low voltage logic tester, and a plurality of control switches in the second controller are used for cooperating with the first controller to control each output pin of the high voltage IC to be connected with the attenuator or not.

2. The interface circuit for using a low voltage logic tester to test a high voltage IC according to claim 1, further comprises an inrush current eliminating circuit for connecting with the high voltage power supply to eliminate an inrush current generated by the high voltage power supply, and provide the high voltage of the high voltage power supply to the high voltage IC.

3. The interface circuit for using a low voltage logic tester to test a high voltage IC according to claim 2, wherein the inrush current eliminating circuit comprises a switch device and a resistor connected serially.

4. The interface circuit for using a low voltage logic tester to test a high voltage IC according to claim 1, wherein the first controller has the internal control switches, the number of the internal control switches corresponds to the number of the output pins of the high voltage IC; when the internal control switches are conducting, the output pins of the high voltage IC will be directly connected with the second controller and the attenuator; when the internal control switches are open, the output pins of the high voltage IC will be in no loading/floating status.

5. The interface circuit for using a low voltage logic tester to test a high voltage IC according to claim 1, wherein the second controller has the plurality of control switches, the number of the plurality of control switches corresponds to the number of the output pins of the high voltage IC; when the plurality of control switches are conducting, the output pins of the high voltage IC will bypass the attenuator and be directly connected with the low voltage logic tester; when the plurality of control switches are open, the outputs of the high voltage IC will pass through the attenuator.

6. The interface circuit for using a low voltage logic tester to test a high voltage IC according to claim 1, wherein the attenuator comprises a plurality of resistor pairs connected serially, the number of the plurality of resistor pairs corresponds to the number of the output pins of the high voltage IC.

7. The interface circuit for using a low voltage logic tester to test a high voltage IC according to claim 6, wherein the resistance ratio of each of the plurality of resistor pairs is 1:9, therefore the output voltage of the high voltage IC will be reduced to $\frac{1}{10}$ thereof, and then sent to the low voltage logic tester.

* * * * *